(12) United States Patent
Dehghan et al.

(10) Patent No.: US 8,671,128 B1
(45) Date of Patent: Mar. 11, 2014

(54) METHOD AND APPARATUS FOR A FINITE IMPULSE RESPONSE FILTER

(75) Inventors: Hossein Dehghan, Danville, CA (US); Karl Kowk Ho Yick, Alameda, CA (US); Sam Heidari, Menlo Park, CA (US)

(73) Assignee: Ikanos Communications, Inc., Fremont, CA (US)

( * ) Notice: Subject to any disclaimer, the term of this patent is extended or adjusted under 35 U.S.C. 154(b) by 1303 days.

(21) Appl. No.: 11/981,847

(22) Filed: Oct. 30, 2007

Related U.S. Application Data

(63) Continuation-in-part of application No. 11/821,351, filed on Jun. 21, 2007, now abandoned.

(60) Provisional application No. 60/805,465, filed on Jun. 21, 2006.

(51) Int. Cl.
- *G06F 17/10* (2006.01)
- *H03H 7/30* (2006.01)
- *H03H 7/40* (2006.01)
- *H03K 5/159* (2006.01)

(52) U.S. Cl.
USPC ........... 708/323; 708/322; 708/300; 708/301; 375/232

(58) Field of Classification Search
USPC ............................ 708/300–323; 375/229–233
See application file for complete search history.

(56) References Cited

U.S. PATENT DOCUMENTS

| | | | |
|---|---|---|---|
| 5,020,078 A * | 5/1991 | Crespo | 375/233 |
| 5,983,254 A * | 11/1999 | Azadet | 708/300 |
| 6,707,850 B1 * | 3/2004 | Blake et al. | 375/233 |
| 6,775,322 B1 * | 8/2004 | Zangi et al. | 375/232 |
| 6,788,738 B1 * | 9/2004 | New | 375/229 |
| 7,006,566 B2 * | 2/2006 | Birru | 375/233 |
| 7,035,329 B2 * | 4/2006 | Jayaraman et al. | 375/233 |
| 7,046,726 B2 * | 5/2006 | Jayaraman et al. | 375/233 |
| 7,120,656 B1 * | 10/2006 | Lam et al. | 708/319 |
| 7,130,366 B2 * | 10/2006 | Phanse et al. | 375/350 |
| 7,248,629 B2 * | 7/2007 | Hatamian | 375/229 |
| 7,471,904 B2 * | 12/2008 | Kaneda et al. | 398/208 |
| 7,555,080 B2 * | 6/2009 | Kim | 375/350 |
| 7,627,064 B2 * | 12/2009 | Said et al. | 375/350 |
| 7,796,708 B2 * | 9/2010 | Yehudai | 375/324 |
| 7,852,915 B2 * | 12/2010 | Chen | 375/233 |
| 8,050,318 B2 * | 11/2011 | Phanse et al. | 375/232 |
| 2005/0232348 A1 * | 10/2005 | Chang | 375/233 |

* cited by examiner

*Primary Examiner* — Chat Do
*Assistant Examiner* — Matthew Sandifer
(74) *Attorney, Agent, or Firm* — Pillsbury Winthrop Shaw Pittman LLP

(57) ABSTRACT

A finite impulse response filter (FIR) for processing a communication channel. The FIR comprises a delay line, a tap processor and a summer. The delay line has "N" taps to successive portions of the communication channel. The delay line shifts the successive portions of the communication channel once in each symbol processing interval. The tap processor subjects each of the "N" taps to a first scaling utilizing first scaling coefficients associated with filtering the current symbol interval and further subjects at least one of the "N" taps to a second scaling by a second scaling coefficient associated with filtering the prior symbol interval. The summer generates in each symbol interval a filtered output comprising a sum of the "N" scaled taps from the first scaling in the prior symbol interval and the second scaling of the at least one tap in the current symbol interval, thereby increasing an order of the FIR without corresponding increase in an order of the delay line.

3 Claims, 6 Drawing Sheets

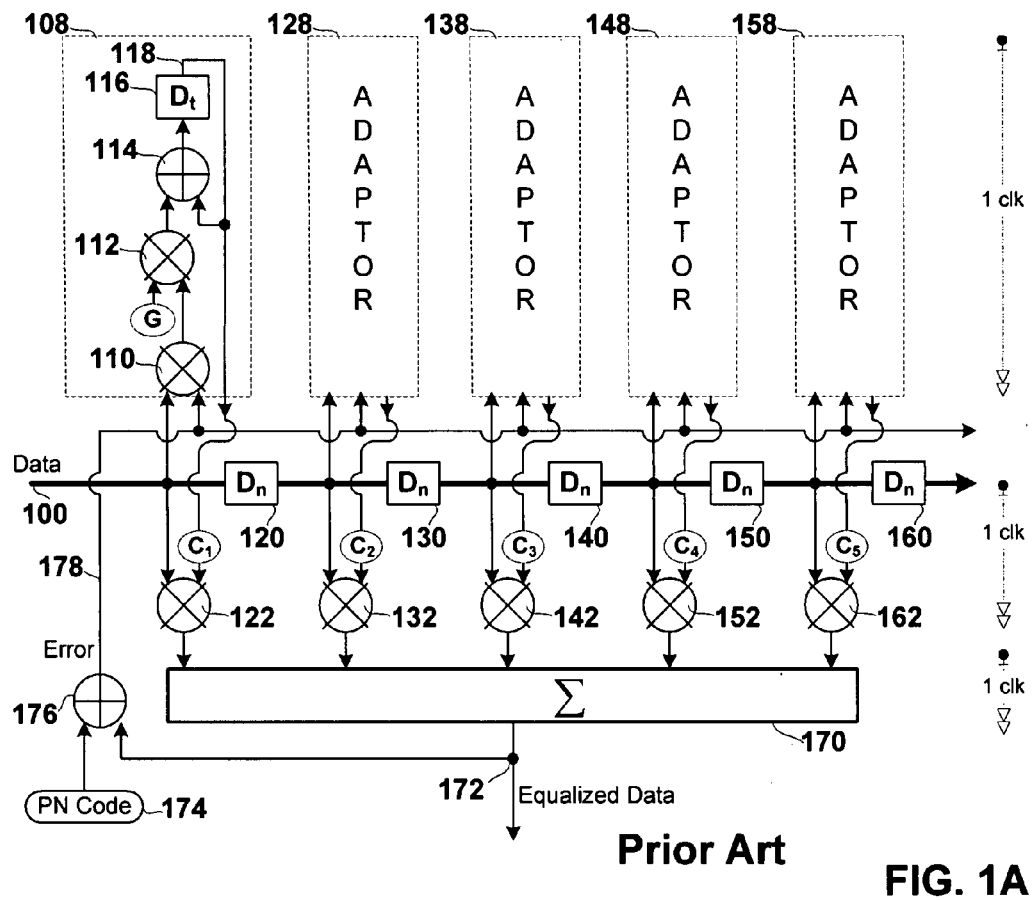
Prior Art
FIG. 1A
FIG. 1B
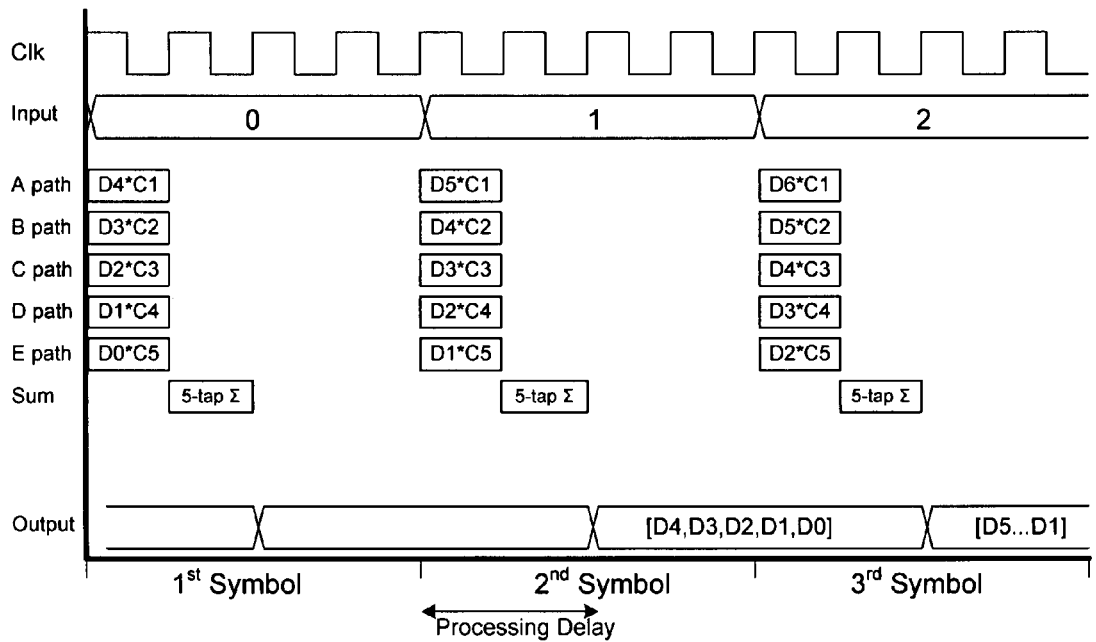

METHOD AND APPARATUS FOR A FINITE IMPULSE RESPONSE FILTER

CROSS REFERENCE TO RELATED APPLICATION

This application is a continuation-in-part of prior filed patent application Ser. No. 11/821,351 filed on Jun. 21, 2007 now abandoned entitled "Method and Apparatus for a Finite Impulse Response Filter" which claims the benefit of prior filed Provisional Applications No. 60/805,465 filed on Jun. 21, 2006 entitled "An Area Efficient Equalizer Structure" both of which are incorporated herein by reference in their entirety as if fully set forth herein.

BACKGROUND OF THE INVENTION

1. Field of Invention

The field of the present invention relates in general to digital filters and specifically finite impulse response filters.

2. Description of the Related Art

A finite impulse response (FIR) filter is a type of digital filter capable of affecting a response to an impulse which ultimately settles to zero. This type of filter can affect almost any frequency response and do so over an interval determined by the length of the delay line which forms the backbone of the filter. In the delay line successive samples of a received signal are subject to the application of fixed or variable weighting coefficients the aggregate of which determines the value of each successive sample output by the filter. The longer the delay line, i.e. the greater the number of taps, the higher the order of the filter and the more finely tuned the response of the filter. After all taps in the delay line are evaluated the delay line is incremented by one sample and the process is repeated to determine the value of the next sample.

A subset of FIR filters identified as time domain equalizers handle the demanding task of equalizing in the time domain the varying propagation delays associated with high speed multipath wired and wireless communications associated with Digital TV broadcast and Cellular telecommunications for example. In these applications it is not unusual for the number of taps in the filter to number several hundred. All the processing associated with aggregating filter values from all the taps must take place at rates consistent with the broadcast or communication channel, which can extend to many Gigabits per second.

What is needed is an improved FIR design.

SUMMARY OF THE INVENTION

A finite impulse response filter (FIR) for processing a communication channel is disclosed. In an embodiment of the invention the FIR comprises: a delay line, a tap processor and a summer. The delay line has "N" taps to successive portions of the communication channel. The delay line shifts the successive portions of the communication channel once in each symbol processing interval. The tap processor subjects each of the "N" taps to a first scaling utilizing first scaling coefficients associated with filtering the current symbol interval and further subjects at least one of the "N" taps to a second scaling by a second scaling coefficient associated with filtering the prior symbol interval. The summer generates in each symbol interval a filtered output comprising a sum of the "N" scaled taps from the first scaling in the prior symbol interval and the second scaling of the at least one tap in the current symbol interval, thereby increasing an order of the FIR without corresponding increase in an order of the delay line.

In an alternate embodiment of the invention a system for filtering a communication channel is disclosed. The system comprises: a differencer, a pair of adaptive finite impulse response filters, a statistical sequence estimator and a blender. The differencer differences a pair of signal inputs and outputs a difference signal corresponding to the difference there between. The pair of adaptive finite impulse response filters (FIR) each has a delay line input and an error signal input and an output. The delay line input of a first of the pair of FIR is coupled to the communication channel and the outputs of the pair of FIR are coupled to the pair of signal inputs of the difference. The statistical sequence estimator has an input coupled to the differencer to alter the difference signal based on statistics therefore and to output an altered difference signal which includes both altered bits or symbols together with associated confidence or likelihood values. The blender has inputs coupled to the differencer and the statistical sequence estimator. The blender is responsive to the confidence or likelihood values in the altered difference signal to vary both a blend of different error signal sources forming a resultant error signal coupled to the error signal inputs of the pair of adaptive FIR as well as the blend of different input signal sources forming a resultant input signal coupled to the delay line input of a second of the pair of FIR, to stabilize the adaptive filtering performed by the pair of FIR.

In an alternate embodiment of the invention a method for filtering a communication channel is disclosed which comprises the acts of:

providing a delay line with "N" taps to successive portions of the communication channel;

shifting the delay line provided in the providing act once in each symbol processing interval;

scaling each of the "N" taps by a corresponding first scaling coefficient associated with filtering the current symbol processing interval;

scaling at least one of the "N" taps by a corresponding second scaling coefficient associated with filtering the prior symbol processing interval; and generating in each symbol interval a filtered output comprising a sum of the "N" scaled taps from the first scaling act of the prior symbol processing interval and the at least one of the "N" scaled taps from the second scaling act of the current symbol processing interval, thereby increasing an order of the FIR without corresponding increase in an order of the delay line.

In another embodiment of the invention an other method for filtering a communication channel is disclosed which comprises the acts of:

subjecting a first set of successive samples of the received communication channel to a first impulse response filtering utilizing weighting coefficients which vary based on an error signal and which minimize at least one of frequency dependent and multi-path dependent variations in a resultant first filtered output;

subjecting a second set of successive samples to a second impulse response filtering utilizing weighting coefficients which vary based on the error signal and which minimize at least one of frequency dependent and multi-path dependent variations in a resultant second filtered output;

generating a difference signal proportional to a difference between the first and second filtered outputs of the subjecting acts;

generating an altered difference signal, based on statistics for the difference signal, which altered difference signal includes both altered bits or symbols of the difference signal together with associated confidence or likelihood values; and blending, responsive to the confidence or likelihood values in the altered difference signal, both different error signal sources to form the error signal as well as different input signal sources to form the second set of successive samples; thereby stabilizing the filtering performed in the subjecting acts.

BRIEF DESCRIPTION OF THE DRAWINGS

These and other features and advantages of the present invention will become more apparent to those skilled in the art from the following detailed description in conjunction with the appended drawings in which:

FIGS. 1A-1B are a hardware block diagram and corresponding timing diagram respectively for a prior art finite impulse response filter (FIR) including adaptive coefficient generation.

DETAILED DESCRIPTION OF THE EMBODIMENTS

Figure 2A:
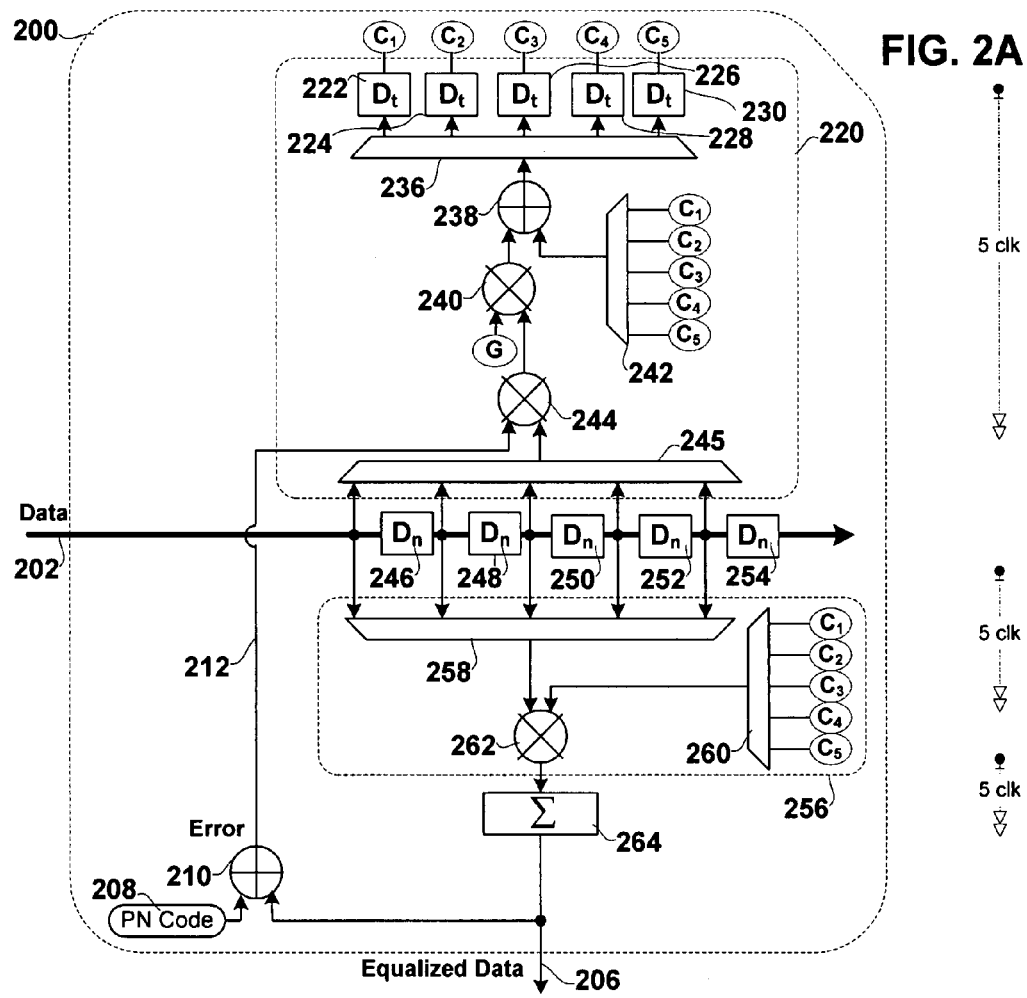
FIGS. 2A-B are a hardware block diagram and corresponding timing diagram respectively for a FIR with a high degree of multiplexing.

FIGS. 1A-1B are a hardware block diagram and corresponding timing diagram respectively for a prior art finite impulse response filter (FIR) including adaptive coefficient generation. The FIR shown has 5 taps and is thus characterized as an "N=5" or a $5^{th}$ order FIR. The FIR includes a delay line 100 comprising 5 delays 120, 130, 140, 150 and 160 and five taps to associated multipliers 122, 132, 142, 152, 162. The inputs to the multipliers include an associated tap and coefficients. Summer 170 sums the scaled output of all the taps and provides filtered data output 172. An error generator is shown comprising a multiplier 176 which accepts input of the filtered data output 172 and a Pseudo Noise code sequence 174 and generates a product there from which corresponds to an error signal 178.

This particular prior art design is adaptive in that the coefficients are not fixed, rather determined dynamically in corresponding ones of the adaptor modules 108, 128, 138, 148, 158. The adaptor modules accept input of the error signal 178 as well as the value associated with the corresponding tap and adaptively generate a coefficient for the multiplier of the associated tap. A representative adaptor 108 is shown in greater detail. This adaptor generates the coefficient C1 for the multiplier of the first tap. The adaptor accepts input of an error signal 178 and the first tap in multiplier 110. The product output by this multiplier is subject to gain scaling in multiplier 112. Adder 114 adds the output of the gain scaling multiplier 112 with the feedback 118 of the prior coefficient and passes the resultant updated tap coefficient to delay 116.

The associated timing diagram for this circuit is shown in FIG. 1B. The processing interval for this circuit is 2 clock cycles.

Figure 2B:
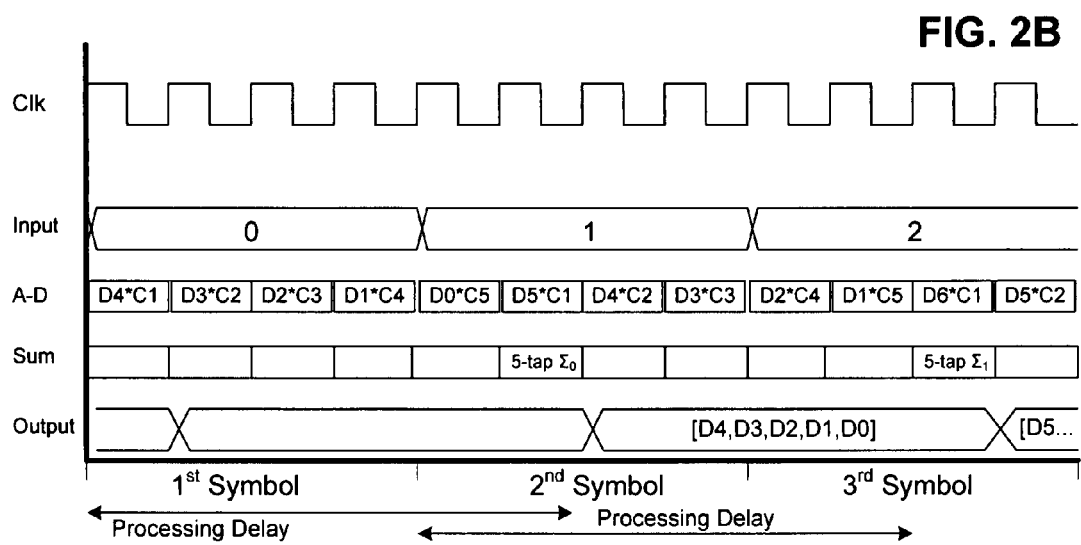

FIGS. 2A-B are a hardware block diagram and corresponding timing diagram respectively for a FIR with a high degree of multiplexing which reduces the hardware requirements associated with long delay lines. The FIR 200 includes an adaptive coefficient generator 220 which is multiplexed across all five taps and a data path processor 256 which is also multiplexed across all taps. Data input 202 from a communication channel is temporarily stored in this five tap embodiment in an associated one of delays 246, 248, 250, 252 and 254 which comprise the delay line. After each shift of the sequential blocks of data from the communication channel, the data path processor, and specifically the tap multiplexer 258, and the coefficient multiplexer 260 process each tap in round robin fashion, by delivering the associated tap and coefficient combination to the multiplier 262 thereof. The products of all five scaled taps are summed in summer 264 and provided as filtered data output 206. The error generator 210 accepts input of the filtered data output 206 and the Pseudo Noise or other code sequence 208 and generates a product there from which corresponds to an error signal 212.

The adaptive coefficient generator 220 accepts input of the error signal 212 at multiplier 244 thereof. The other input of the multiplier 244 is provided by tap multiplexer 245 which is also multiplexed across all taps. The product of each successive tap and error signal is gain scaled in multiplier 240. Next, the product of the multiplier 240 is added in adder 238 to the corresponding coefficient provided by coefficient multiplexer 242. The sum is output by de-multiplexer 236 to an associated one of delays 222, 224, 226, 228, 230 coupled thereto.

The associated timing diagram for this circuit is shown in FIG. 2B. The processing interval for this circuit is 5 clock cycles on the first iteration and increases linearly thereafter. For many applications this is not acceptable in two regards. First, only 4 clock cycles are available for processing each symbol, and for many applications all processing must be processed in less than one symbol interval. Secondly, the processing interval of this embodiment actually increases over time, rendering the design useful only for packet based and bursty communications.

Figure 3A:
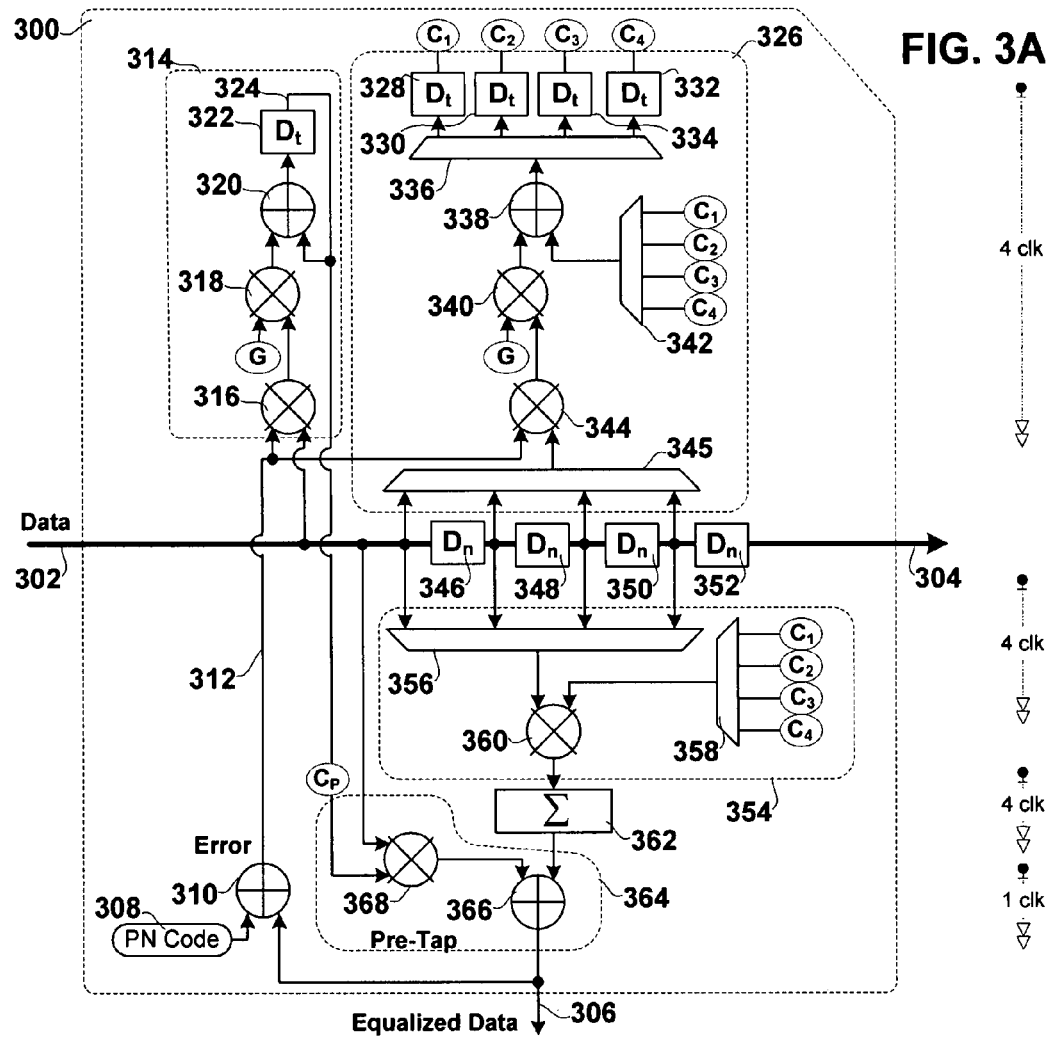
FIGS. 3A-B are a hardware block diagram and corresponding timing diagram respectively for a FIR with both a high degree of multiplexing and a pre-tap in accordance with an embodiment of the invention.
Figure 3B:
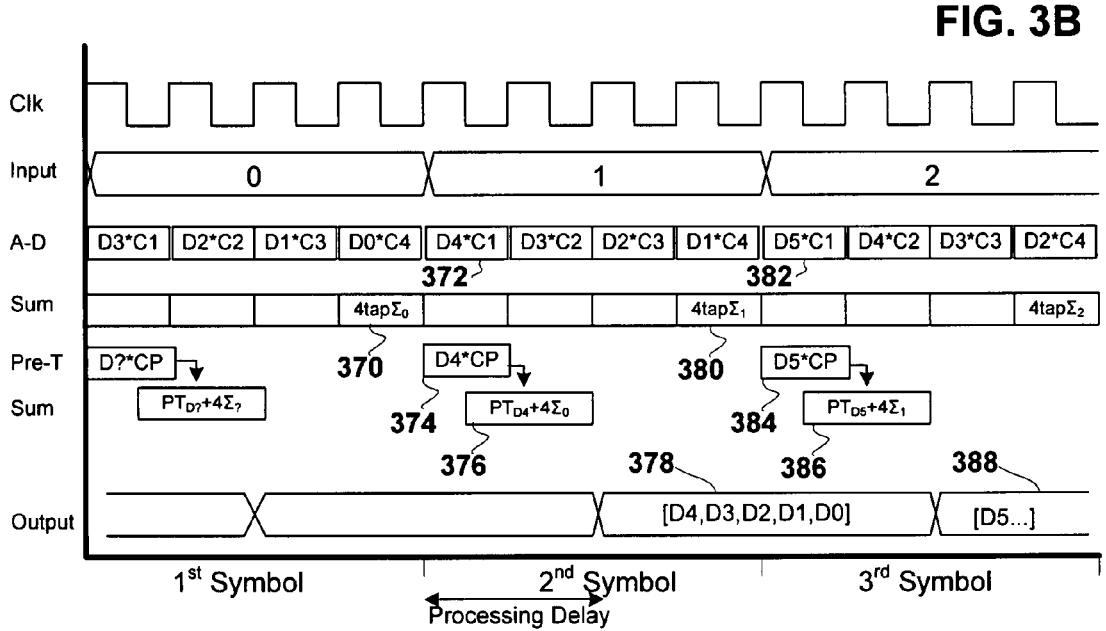

FIGS. 3A-B are a hardware block diagram and corresponding timing diagram respectively for a FIR with both a high degree of multiplexing and a pre-tap in accordance with an embodiment of the invention. In this embodiment of the invention the novel pre-tap retains the resolution of a five tap delay line filter such as shown in FIG. 1A and avoids the extended processing interval associated with the adaptive multiplexed FIR shown in FIG. 2A. The hardware requirements and circuit are significantly reduced when compared with the prior art FIR shown in FIG. 1A.

The FIR 300 includes both a multiplexed and non-multiplexed adaptive coefficient generators 326 and 314 respectively. The FIR also includes a multiplexed tap or delay path processor 354 and a pre-tap 364. The combination of the summed output from the four scaled taps on the delay line in a first symbol processing interval with the scaled output from the pre-tap in the subsequent symbol processing interval results in a higher order filter resolution than that of the delay line itself. In the embodiment shown in FIGS. 3A, 3B the filter has a $5^{th}$ order filter resolution equivalent to the 5 tap filter shown in FIG. 1A but achieves the resolution from a 4 tap delay line. In operation data from the communication channel is received at input 302 and in each symbol processing interval shifted to the neighboring one of four delays 346, 348, 350, 352 which make up the delay line. In an embodiment of the invention further extension of the delay line is achieved by a multi-stage approach in the manner shown in FIG. 4 via coupling the output 304 of the FIR to the input of a neighboring stage.

At the onset of each symbol processing interval the delay line contents are shifted to accept a new block of data. Within the symbol processing interval the "N=4" sequential blocks of data from the communication channel that reside in the delay line are processed. In this embodiment of the invention the processing is multiplexed both as to coefficient generation as well as to tap scaling.

The scaling of the "N=4" taps is handled by the data path processor 354. The tap multiplexer 356, and the coefficient multiplexer 358 scale each of the "N=4" taps in round robin fashion, and deliver the associated tap and coefficient combination to the multiplier 360 thereof. The products of all "N=4" scaled taps from the multiplier are summed in summer 362 and provided as an input to the pre-tap. The processing provided by the pre-tap extends the length of the delay line by at least one tap. The required delay associated with the tap, is achieved by design of the processing interval of the data path processor, which utilizes the delay for processing and then picks up the value from the input 302 to the delay line after the next shift of the delay line contents at the onset of the next symbol processing interval. The pre tap comprises a multiplier 368 and an adder 366. The multiplier accepts a pre-tap coefficient generated by adaptive coefficient generator 314, and the data 302 from the first tap on the delay line. The product is added in adder 366 with the "N=4" scaled tap summation from summer 362 and provided as filtered output 306. By overlapping tap processing across successive symbol processing intervals, this embodiment of the invention, allows an "N=4" tap delay line to achieve the same resolution at the filtered output 306 as the five tap FIRS shown in FIGS. 1A and 2A, see Ref. 390.

Figure 4:
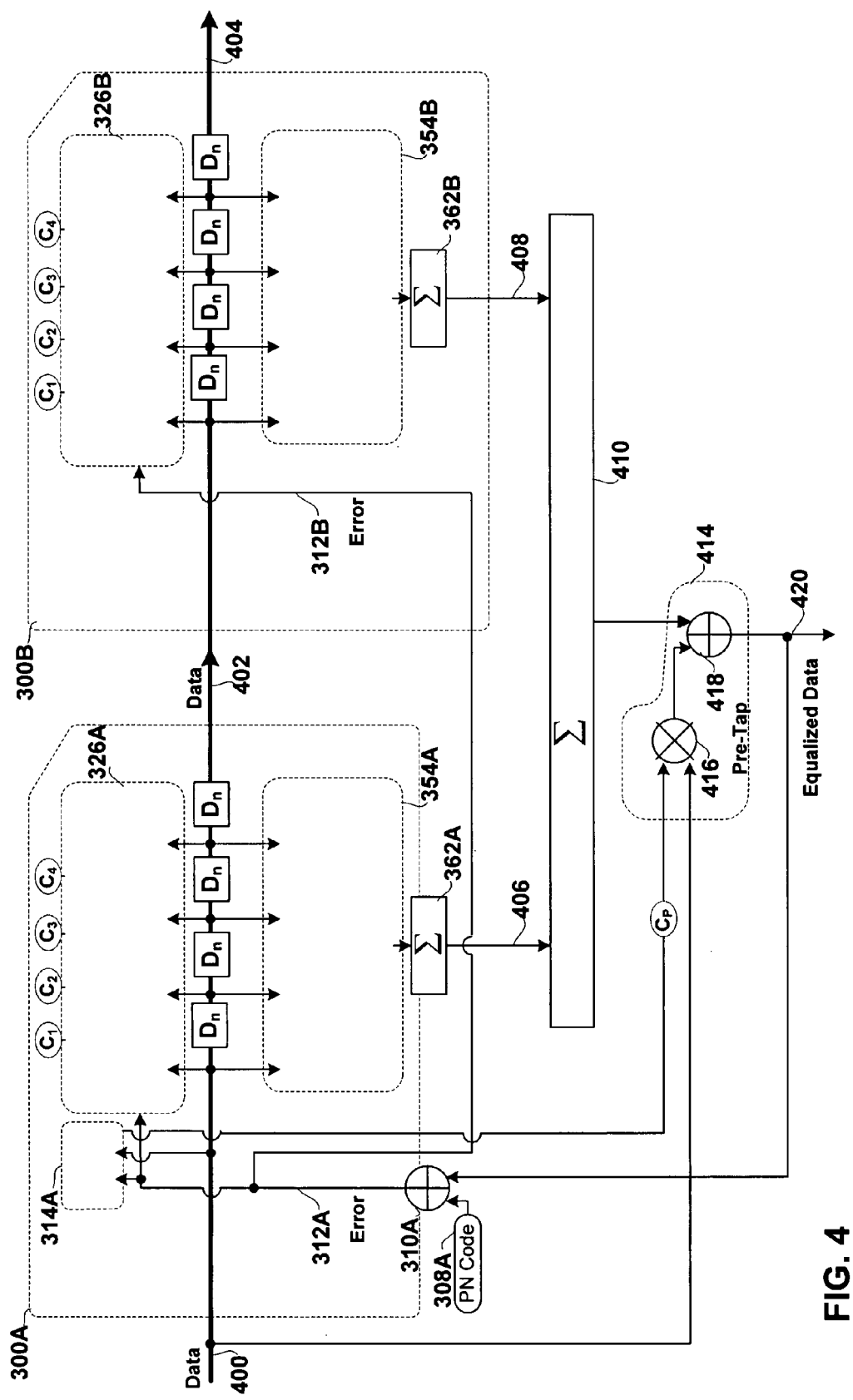
FIG. 4 is a hardware block diagram of the FIR of FIG. 3A scaled to extend the length of the associated delay line and the resolution of the filter.

More generally, in alternate embodiments of the invention, the FIR architecture set forth in this and the following FIG. 4 can extend the resolution of an $N^{th}$ order delay line to "N+Pt" where Pt is the number of pre-taps.

The error generator 310 accepts input of the filtered data output 306 and the Pseudo Noise or other code sequence 308 and generates a product there from which corresponds to an error signal 312.

The adaptive coefficient generator 326 accepts input of the error signal 312 at multiplier 344 thereof. The other input of the multiplier 344 is provided by tap multiplexer 345 which is also multiplexed across all four taps. The product of each successive tap and error signal is gain scaled in multiplier 340. Next, the product of the multiplier 340 is added in adder 338 to the corresponding coefficient provided by coefficient multiplexer 342. The sum is output by de-multiplexer 336 to an associated one of four delays 328, 330, 332, and 334 coupled thereto. The coefficient generation for the pre-tap 364 is handled by coefficient generator 314. This adaptor generates the coefficient CP for the multiplier of the pre-tap 364. The adaptor accepts input of an error signal 312 and the input from at least the first tap of the delay line in multiplier 316. The product output by this multiplier is subject to gain scaling in multiplier 318. Adder 320 adds the output of the gain scaling multiplier 318 with the feedback 324 of the prior coefficient and passes the resultant updated tap coefficient Cp to the pre-tap.

The associated timing diagram for this circuit is shown in FIG. 3B. The processing delay is only two clock cycles. The data output, e.g. reference 390, is identical to the five tap designs shown in FIGS. 1A and 2A, where the Bracket notation corresponds to the data components of the filtered output, e.g. [D4,D3,D2,D1,D0] representing the associated data block with coefficient scaling. Symbol intervals: 0, 1 and 2 are shown, each of 4 clock cycles in duration. In the $0^{th}$ symbol processing interval the "N=4" scaled tap sum 370 is calculated.

At the onset of the next, i.e. symbol processing interval, the delay line contents are shifted to take in the next block of data, "D4". This data from the first tap is scaled 372 by C1 in the data path processor and 374 by Cp in the pre-tap. These two discrete scaling of the first tap are accomplished in parallel in the first clock cycle of the symbol processing interval. In the second clock cycle of the symbol processing interval the scaled pre-tap 374 is added 376 to the N="4" tap sum 370 from the prior, e.g. $0^{th}$ symbol processing interval to generate the filtered output 378 with a resolution equivalent to a delay line with "N+1" taps. In the last clock cycle of the $1^{st}$ symbol processing interval the "N=4" scaled tap sum 380 is calculated.

At the onset of the next, i.e. $2^{th}$ symbol processing interval, the delay line contents are shifted to take in the next block of data, "D5". This data from the first tap is scaled 382 by C1 in the data path processor and 384 by Cp in the pre-tap. These two discrete scalings of the first tap are accomplished in parallel in the first clock cycle of the symbol processing interval. In the second clock cycle of the symbol processing interval the scaled pre-tap 384 is added 386 to the N="4" tap sum 380 from the prior, e.g. $1^{st}$ symbol processing interval to generate the filtered output 388 with a resolution equivalent to a delay line with "N+Pt" taps where Pt is the number of pre-taps.

FIG. 4 is a hardware block diagram of the FIR of FIG. 3A scaled to extend the length of the associated delay line and the resolution of the filter. Two filters 300A and 300B corresponding to filter 300 in FIG. 3A are shown. Similar components are assigned "A" or "B" suffixes appended to the corresponding reference number from FIG. 3. Data input 400 is provided to the delay line of the first filter 300A and its output 402 is provided as input to the second filter 300B. Additional delay path extension is achieved by coupling to the output 404 of the second filter 300B. The summer 410 sums the outputs of all filters in the chain, e.g. outputs 406 and 408. The output of the summer is provided to the pre-tap 414, and specifically the adder 418 thereof. The other input to the adder is the multiplier 416, which generates a product from the coefficient generated by coefficient generator 314A of the filter 300A and the data 400 at the input of the delay line. The adder 418 provides filtered data 420 at the output.

In an embodiment of the invention the $2^{nd}$ and subsequent stages may each include their own pre-tap(s) to enhance the resolution of the filtered output without any corresponding increase in the length of the delay line.

Figure 5:
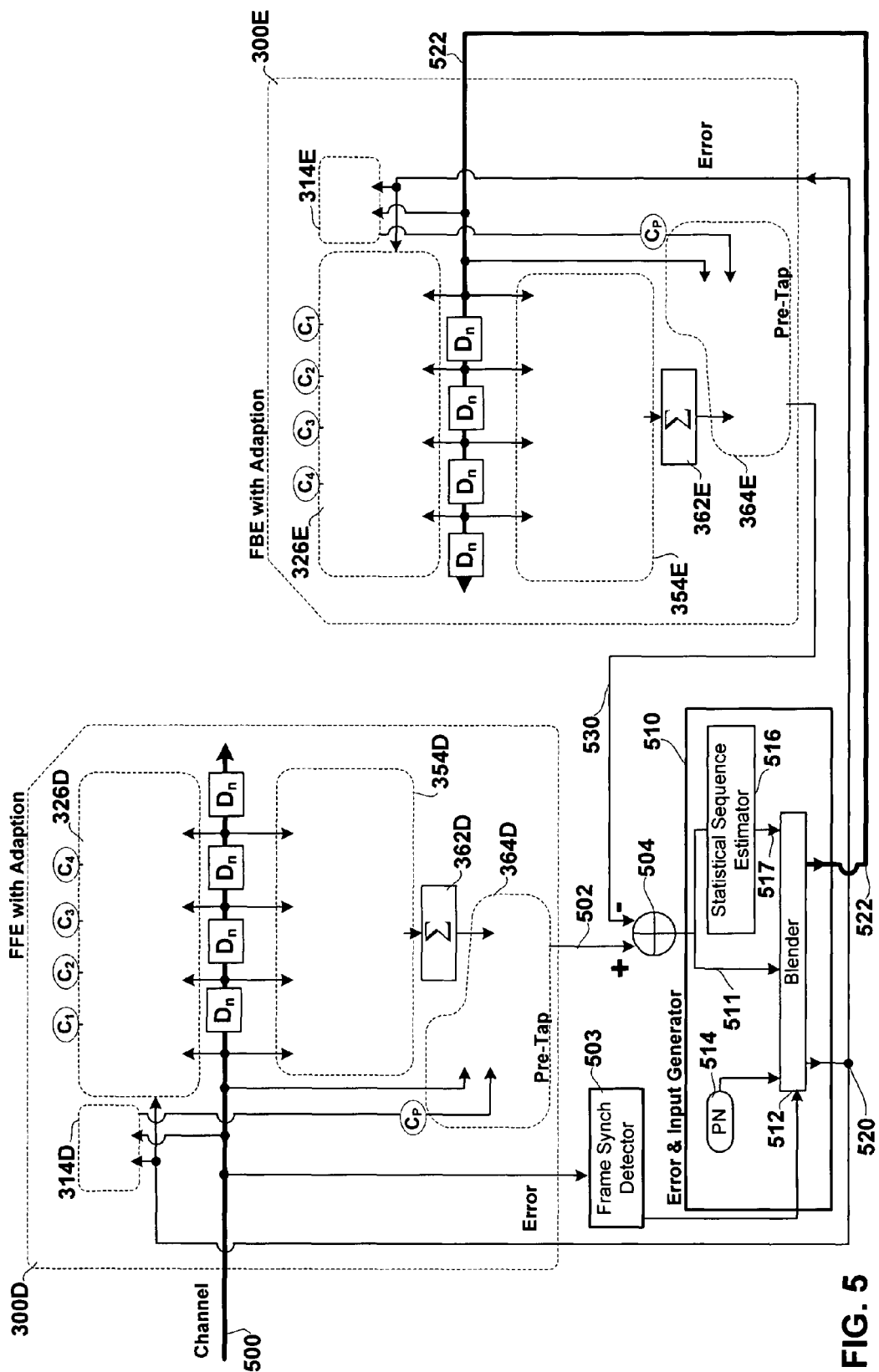
FIG. 5 is a hardware block diagram of an embodiment of the FIR of FIG. 3A in an adaptive equalizer.

FIG. 5 is a hardware block diagram of an embodiment of the FIR of FIG. 3A in an adaptive equalizer. Components labeled with letter suffixes are identical to the corresponding components shown without letter suffix in FIG. 3A. Adaptive equalizers may be used with particular advantage in single channel reception of TV or other broadcast signals, to offset the degradation of signal quality resulting from multipath delays. The first FIR 300D includes: multiplexed coefficient generator 326D, non-multiplexed pre-tap coefficient generator 314D, delay path processor 354D, summer 362D and a pre-tap 364D. The second FIR 300E includes: multiplexed coefficient generator 326E, non-multiplexed pre-tap coefficient generator 314E, delay path processor 354E, summer 362E and a pre-tap 364E.

A received signal 500 is subject to Feed Forward Equalization (FFE) in FIR 300D. The filtered output 508 from this FIR is provided to differencer 504 along with the filtered output 530 of FIR 300E serving as a Feed Back Equalizer (FBE). The differencer 504 outputs a difference signal corresponding to the difference between the filtered outputs 508, 530 from the two FIRS and delivers that difference signal to the input of the Error and Feed Back Input generator 510. A frame synch detector 503 accepts input of the received communication channel and delivers a frame synchronization signal derived there from to the error and input generator 510.

The error and input generator 510 includes: a statistical sequence estimator 516, a Pseudo Noise Code Sequence (PN) 514, and a blender 512. The statistical sequence estimator maintains a rolling history of the difference signal input 511 from the differencer 504. The statistical sequence estimator uses the rolling history to statistically evaluate the difference signal and to output an altered difference signal 517 to the blender. The altered difference signal includes a confidence value for each bit or symbol altered by the statistical sequence estimator.

In an embodiment of the invention the statistical sequence estimator may be implemented as a hard slicer, e.g. a binary slicer which receives non-binary input values and maps each value to its nearest binary neighbor and outputs the resultant binary values together with an associated confidence or likelihood value corresponding to the proximity of the non-binary input and the sliced binary output value.

In an other embodiment of the invention, the statistical sequence estimator may implement a Viterbi decoding algorithm which alters received bits or symbols of the difference signal 511 to their likeliest values and outputs both the altered bit/symbol along with an associated confidence value or likelihood value for same, both of which are provided to the blender as an altered difference signal 517.

The blender accepts input of the pseudo noise code sequence 514, the difference signal 511 from the differencer 504, the altered difference signal 517 from the statistical sequence estimator, and control input from the frame synch detector 503, in the form of the frame synchronization signal which indicates whether frame synchronization has been achieved or not.

The blender outputs an error signal 520 which drives the error signal inputs of the filters 300D, 300E and specifically the coefficient generators 314D, 326D in filter 300D as well as coefficient generators 314E, 326E in filter 300E. The error signal is derived from a variety of sources depending on frame synchronization and the confidence/likelihood values output by the statistical sequence estimator. When the received signal includes a training or synchronization sequence and the framer synch detector indicates that frame synchronization has been achieved, the blender generates an error signal which corresponds to a difference between the pseudo noise code sequence 514 and the difference signal 511. When either the received signal does not include a training sequence or the frame synchronization signal indicates that frame synchronization has not been achieved, the blender generates the error signal based on the confidence/likelihood values in the altered difference signal 517. When likelihood values are above an upper threshold level the error signal comprises the difference between the difference signal 511 and the altered difference signal 517. When likelihood values are below a lower threshold level the error signal is independently derived from an adaptive blind error estimation algorithm such as the Constant Modulus Algorithm (CMA), currently in favor with those skilled in the art for error correction in communication systems which lack training signals. At likelihood values between the lower and upper thresholds, the error signal 520 output by the blender comprises a blend of the CMA error value with the difference of signals 511 and 517. The blend may be linear or non-linear with respect to the corresponding likelihood value.

The blender also outputs a blended output signal 522 to the delay line input of the FIR 300E. The output signal from the blender corresponds to a blend of the three inputs, i.e. the difference signal, the altered difference signal, and the pseudo noise code sequence. The proportion of each of the three inputs in the output 522 of the blender depends on a number of factors including: frame synchronization and the confidence/likelihood values output by the statistical sequence estimator. When the received signal includes a training or synchronization sequence and the frame synch detector indicates that frame synchronization has been achieved, the output signal 522 comprises the pseudo noise code sequence 514. When either the received signal does not include a training sequence or the frame synchronization signal indicates that frame synchronization has not been achieved, the blender generates the error signal based on the confidence/likelihood values in the altered difference signal 517. When likelihood values are above an upper threshold level the output signal 522 comprises the altered difference signal 517. When likelihood values are below a lower threshold level the output signal comprises the difference signal 511. At likelihood values between the lower and upper thresholds, the output signal 522 comprises a blend of the difference signal 511 and the altered difference signal 517. The blend may be linear or non-linear with respect to the corresponding likelihood value.

The blending of different error signal sources and output signal sources by the blender stabilizes the adaptive equalization performed by the pair of FIR even in the presence of multiple transmission paths encountered in television or other forms of wired or wireless communication.

Figure 6:
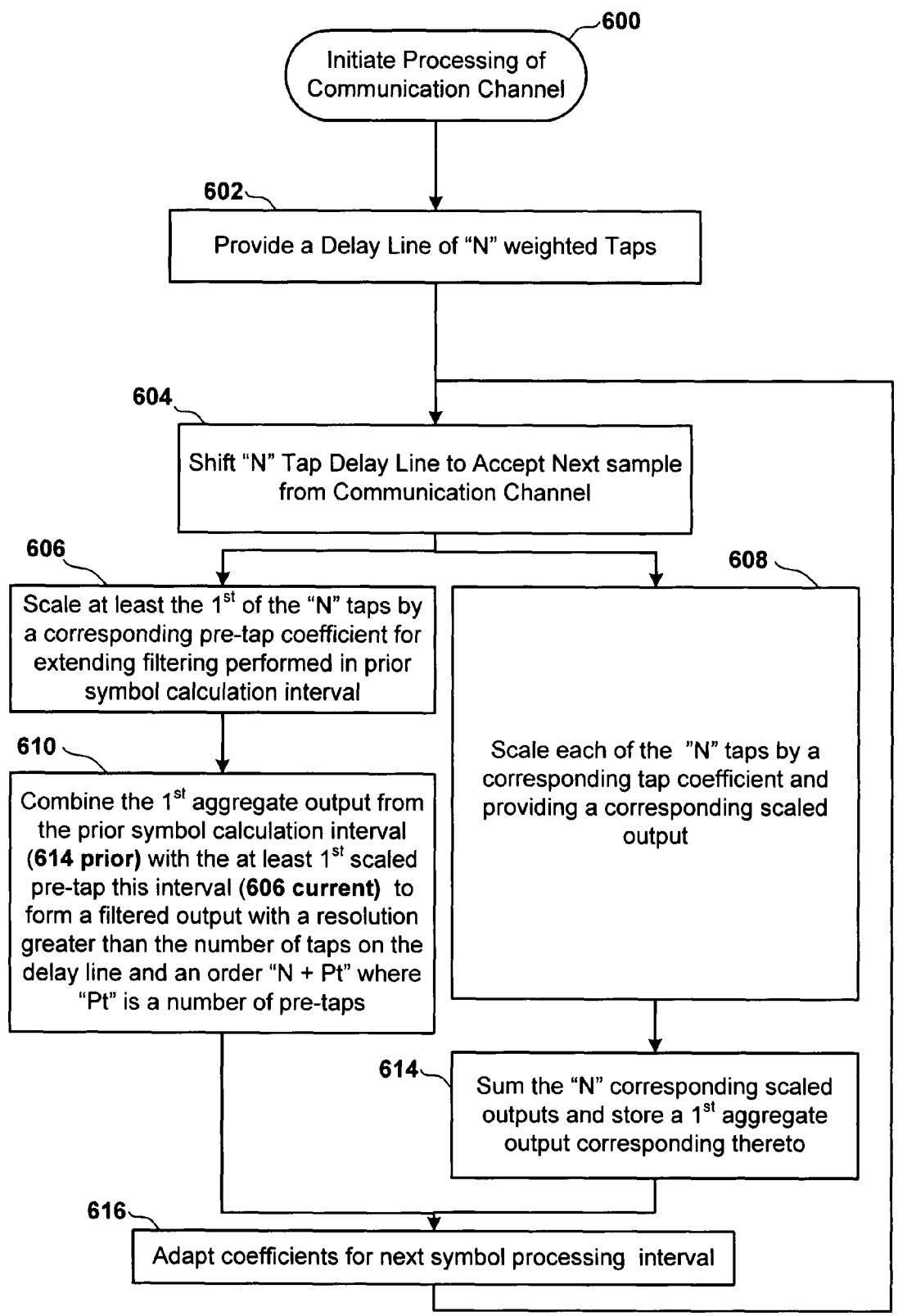
FIG. 6 is a process flow diagram of the processes implemented by the FIR shown in FIG. 3A.

FIG. 6 is a process flow diagram of the processes implemented by the FIR shown in FIG. 3A. The processes provide for subjecting at least one of the "N" taps of a delay line to two discrete scalings in each symbol processing interval, the first scaling for filtering the current symbol interval and the second scaling for extending the filtering of the "N" scaled taps of the prior symbol interval, thereby extending resolution, a.k.a. order, of filter without corresponding increase in a length of the delay line. After initiating processing of the communication channel in process 600, and provisioning of a delay line of "N" weighted taps in process 602 control passes to process 604.

In process 604 the next sample is accepted by the delay line by shifting of the data from one delay block to the next. This shift in the delay line marks the onset of the symbol processing interval. In this symbol processing interval, processes are performed in parallel with one another, specifically process 606 in parallel with process 608. In processes 606 at least the first of the number "N" taps of the delay line is scaled by a corresponding pre-tap coefficient(s) which will be used to extend the filtering performed in the prior symbol processing interval. In process 608 all of the number "N" taps of the delay line are scaled by corresponding tap coefficients. Although at least one of the tap(s) scaled in both process is/are the same, the coefficients are distinctly calculated to equalize the expanded tap sequence of which they are apart, i.e. the prior or the current symbol processing interval. The pre-tap coefficient(s) calculated in process 606 is adapted to enhance the resolution, a.k.a. order, of the filtration or equalization of the prior symbol processing interval, while the tap coefficient(s) calculated in process 608 are adapted to filter or equalize the current symbol processing interval. This overlapping use of taps between current and prior symbol processing intervals allows increased resolution, a.k.a. order, of the filtered output of the FIR without the requirement of a longer delay line or delay line processing interval.

In process 610 the $1^{st}$ aggregate output from the prior symbol calculation interval is combined with the at least $1^{st}$ scaled pre-tap from the current symbol calculation interval. The resultant sum comprises the filtered output of the FIR for the prior symbol processing interval and has a resolution equivalent to a delay line of "N+Pt" where Pt is the number of pre-taps. Then in process 614 the sum of the "N" corresponding scaled tap outputs from process 608 is determined and stored as a $1^{st}$ aggregate output corresponding thereto. In an embodiment of the invention such as that shown in FIGS. 3A, 3B no dedicated storage component is required for carrying the $1^{st}$ aggregate output over to the next symbol interval, rather the timing of the multiplexed components is set to provide the first aggregate output from the summer 362 (See FIG. 3A) to the input of the pre-tap in the same clock cycle as the scaled product from the pre-taps' multiplier 368 becomes available. Next in process 616 any adaption of pre-tap and tap coefficients is performed, subsequent to which control returns to process 604 for the processing of the next shift of the delay line. In the embodiment of the invention shown in FIGS. 3A, 3B coefficients are adaptively calculated in parallel with the scaling of taps and pre-tap(s), rather than subsequent thereto.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A system for filtering a communication channel, and comprising:
   - a differencer for differencing a pair of signal inputs and outputting a difference signal corresponding to the difference there between;
   - a pair of adaptive finite impulse response filters (FIR) each having a delay line input and an error signal input and an output and the delay line input of a first of the pair of FIR coupled to the communication channel and the outputs of the pair of FIR coupled to the pair of signal inputs of the difference;
   - a statistical sequence estimator with an input coupled to the differencer to alter the difference signal based on statistics therefore and to output an altered difference signal which includes both altered bits or symbols together with associated confidence or likelihood values; and
   - a blender with an inputs coupled to the differencer and the statistical sequence estimator and the blender responsive to the confidence or likelihood values in the altered difference signal to vary both a blend of different error signal sources forming a resultant error signal coupled to the error signal inputs of the pair of adaptive FIR as well as the blend of different input signal sources forming a resultant input signal coupled to the delay line input of a second of the pair of FIR, to stabilize the adaptive filtering performed by the pair of FIR.

2. The system of claim 1, wherein at least one of the pair of adaptive FIR further comprise:
   - a delay line with "N" taps to successive portions of the communication channel, and the delay line shifting the successive portions of the communication channel once in each symbol processing interval;
   - at least one tap processor subjecting each of the "N" taps to a first scaling utilizing first scaling coefficients associated with filtering the current symbol interval and further subjecting at least one of the "N" taps to a second scaling by a second scaling coefficient associated with filtering the prior symbol interval; and
   - at least one summer generating in each symbol interval a filtered output comprising a sum of the "N" scaled taps from the first scaling in the prior symbol interval and the second scaling of the at least one tap in the current symbol interval, thereby increasing an order of the FIR without corresponding increase in an order of the delay line.

3. A method for filtering a communication channel, comprising:
   - subjecting a first set of successive samples of the received communication channel to a first impulse response filtering using a first finite impulse response (FIR) filter that utilizes weighting coefficients which vary based on an error signal and which minimize at least one of frequency dependent and multi-path dependent variations in a resultant first filtered output;
   - subjecting a second set of successive samples to a second impulse response filtering using a second finite impulse response (FIR) filter that utilizes weighting coefficients which vary based on the error signal and which minimize at least one of frequency dependent and multi-path dependent variations in a resultant second filtered output;
   - generating a difference signal proportional to a difference between the first and second filtered outputs;
   - generating an altered difference signal, based on statistics for the difference signal, which altered difference signal includes both altered bits or symbols of the difference signal together with associated confidence or likelihood values; and
   - blending, responsive to the confidence or likelihood values in the altered difference signal, both different error signal sources to form the error signal as well as different input signal sources to form the second set of successive samples; thereby stabilizing the filtering performed.

* * * * *

UNITED STATES PATENT AND TRADEMARK OFFICE
CERTIFICATE OF CORRECTION

PATENT NO. : 8,671,128 B1
APPLICATION NO. : 11/981847
DATED : March 11, 2014
INVENTOR(S) : Dehghan et al.

Page 1 of 1

It is certified that error appears in the above-identified patent and that said Letters Patent is hereby corrected as shown below:

In the Specification:

In Column 6, Line 6, delete "i.e." and insert -- i.e. $1^{st}$ --, therefor.

In Column 6, Line 19, delete "$2^{th}$" and insert -- $2^{nd}$ --, therefor.

Signed and Sealed this
Tenth Day of June, 2014

Michelle K. Lee
*Deputy Director of the United States Patent and Trademark Office*